US011243258B2

(12) United States Patent
Ramezan Pour Safaei et al.

(10) Patent No.: US 11,243,258 B2
(45) Date of Patent: Feb. 8, 2022

(54) METHOD FOR APPROXIMATING ALGORITHMS FOR FAST CHARGING LI-ION BATTERIES BASED ON ELECTROCHEMICAL BATTERY MODELS

(71) Applicant: Robert Bosch GmbH, Stuttgart (DE)

(72) Inventors: Farshad Ramezan Pour Safaei, Los Gatos, CA (US); Anantharaman Subbaraman, Mountain View, CA (US); Nikhil Ravi, Redwood City, CA (US); Reinhardt Klein, Mountain View, CA (US); Gerd Simon Schmidt, Palo Alto, CA (US); Yongfang Cheng, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 431 days.

(21) Appl. No.: 16/188,404

(22) Filed: Nov. 13, 2018

(65) Prior Publication Data
US 2020/0150185 A1 May 14, 2020

(51) Int. Cl.
*G01R 31/367* (2019.01)
*G01R 31/389* (2019.01)
*G01R 31/392* (2019.01)

(52) U.S. Cl.
CPC .......... *G01R 31/367* (2019.01); *G01R 31/389* (2019.01); *G01R 31/392* (2019.01)

(58) Field of Classification Search
CPC ............................ G01R 31/367; G06F 16/337
USPC ........................................................ 702/63
See application file for complete search history.

(56) References Cited

U.S. PATENT DOCUMENTS

| | | | |
|---|---|---|---|
| 8,643,342 B2 | 2/2014 | Mehta et al. | |
| 9,153,991 B2 | 10/2015 | Chaturvedi et al. | |
| 9,664,745 B1* | 5/2017 | Fearn | H02J 7/00712 |
| 2004/0117137 A1* | 6/2004 | Jin | G01R 31/3842 |
| | | | 702/63 |
| 2010/0148731 A1 | 6/2010 | Notten et al. | |
| 2013/0311115 A1 | 11/2013 | Chaturvedi et al. | |

(Continued)

OTHER PUBLICATIONS

Yan, J. et al., "Model Predictive Control-Based Fast Charging for Vehicular Batteries," Energies, vol. 4, pp. 1178-1196, 2011 (19 pages).

*Primary Examiner* — Ricky Go
(74) *Attorney, Agent, or Firm* — Maginot, Moore & Beck LLP

(57) ABSTRACT

A method, system, and non-transitory computer readable medium for determining a pseudo-optimal charging algorithm for a specific battery are disclosed. An electrochemical battery model is characterized based on the physical characteristics of a specific battery. An optimal charging profile is determined for the specific battery using the highly accurate electrochemical battery model. A pseudo-optimal charging profile is determined which closely approximates the optimal charging profile. However, the pseudo-optimal charging profile is comprised of simple building blocks which are easily and efficiently implemented in embedded applications having limited computational power/memory. An optimization process is used to determine optimal control parameters for the simple building blocks, trigger conditions and thresholds, and adaptation parameters for adapting the pseudo-optimal charging profile as the battery ages.

16 Claims, 7 Drawing Sheets

(56) References Cited

U.S. PATENT DOCUMENTS

| | | | |
|---|---|---|---|
| 2014/0062415 A1* | 3/2014 | Barsukov | H02J 7/00041 |
| | | | 320/134 |
| 2017/0077717 A1* | 3/2017 | Lundgren | H02J 7/0047 |
| 2017/0288417 A1 | 10/2017 | Trichy | |
| 2017/0338666 A1 | 11/2017 | Christensen et al. | |
| 2018/0145526 A1 | 5/2018 | Ravi et al. | |
| 2018/0321730 A1* | 11/2018 | Mandli | H02J 7/007 |
| 2019/0123574 A1* | 4/2019 | Jung | H01M 10/44 |

* cited by examiner

METHOD FOR APPROXIMATING ALGORITHMS FOR FAST CHARGING LI-ION BATTERIES BASED ON ELECTROCHEMICAL BATTERY MODELS

FIELD

The device and method disclosed in this document relates to battery charging and, more particularly, to methods for charging lithium-ion (Li-ion) batteries.

BACKGROUND

Unless otherwise indicated herein, the materials described in this section are not prior art to the claims in this application and are not admitted to the prior art by inclusion in this section.

Batteries are electrochemical energy storage devices that convert chemical energy into electrical energy and vice versa. One particular type of battery is a Li-ion battery. Lithium-ion batteries are desirable energy storage devices for portable electronics and electric and hybrid-electric vehicles, among other devices and systems, because they have a high specific energy compared to other electrochemical energy storage devices.

A key requirement for widespread adoption of battery technologies is providing a quick charging time, without hastening degradation of usable capacity. State-of-the-art charging systems often employ some variation of a constant-current constant-voltage (CCCV) charging procedure. In a CCCV charging procedure, a constant current is applied to the battery until a certain voltage is reached. Upon reaching the certain voltage, a constant voltage is maintained until the charging current falls below a specified threshold, at which point the battery is considered fully charged. This charging procedure is robust and simple to implement, however it also suffers from a fairly long charging time. More sophisticated charging strategies can provide a faster charging time, but often require complex real-time calculations which make such strategies impractical for embedded applications having limited memory and processing capability.

SUMMARY

A method of approximating an optimal charging profile for a particular battery is disclosed. The method comprises: storing, in a memory, an electrochemical battery model, the electrochemical battery model being parameterized based on physical characteristics of the particular battery; determining, with a processor, a first charging profile that minimizes a charging time for the particular battery and minimizes a degradation of the particular battery using the electrochemical battery model; and determining, with the processor, a first set of parameters that define a second charging profile that is formed by an ordered sequence of charging phases that approximates the first charging profile, each charging phase in the ordered sequence being characterized by (i) a respective first parameter in the first set of parameters indicating a respective control strategy that is to be used to control a charging current during the respective charging phase, (ii) a respective second parameter in the first set of parameters indicating a value of a control parameter of the respective control strategy, (iii) a respective third parameter in the first set of parameters indicating a respective trigger condition which, when satisfied, triggers the respective charging phase to end, and (iv) a respective fourth parameter in the first set of parameters indicating a value of a threshold parameter of the respective trigger condition.

A system for approximating an optimal charging profile for a particular battery is disclosed. The system comprises: a data storage device configured to a plurality of instructions, the plurality of instructions including instructions corresponding to an electrochemical battery model, the electrochemical battery model being parameterized based on physical characteristics of the particular battery; and at least one processor operably connected to the data storage device. The at least one processor is configured to execute the plurality of instructions on the data storage device to: determine a first charging profile that minimizes a charging time for the particular battery and minimizes a degradation of the particular battery using the electrochemical battery model; and determine a first set of parameters that define a second charging profile that is formed by an ordered sequence of charging phases that approximates the first charging profile, each charging phase in the ordered sequence being characterized by (i) a respective first parameter in the first set of parameters indicating a respective control strategy that is to be used to control a charging current during the respective charging phase, (ii) a respective second parameter in the first set of parameters indicating a value of a control parameter of the respective control strategy, (iii) a respective third parameter in the first set of parameters indicating a respective trigger condition which, when satisfied, triggers the respective charging phase to end, and (iv) a respective fourth parameter in the first set of parameters indicating a value of a threshold parameter of the respective trigger condition.

A non-transitory computer readable medium for approximating an optimal charging profile for a particular battery is disclosed. The computer readable medium stores a plurality of instructions which are configured to, when executed, cause at least one processor to: store, in a memory, an electrochemical battery model, the electrochemical battery model being parameterized based on physical characteristics of the particular battery; determine a first charging profile that minimizes a charging time for the particular battery and minimizes a degradation of the particular battery using the electrochemical battery model; and determine a first set of parameters that define a second charging profile that is formed by an ordered sequence of charging phases that approximates the first charging profile, each charging phase in the ordered sequence being characterized by (i) a respective first parameter in the first set of parameters indicating a respective control strategy that is to be used to control a charging current during the respective charging phase, (ii) a respective second parameter in the first set of parameters indicating a value of a control parameter of the respective control strategy, (iii) a respective third parameter in the first set of parameters indicating a respective trigger condition which, when satisfied, triggers the respective charging phase to end, and (iv) a respective fourth parameter in the first set of parameters indicating a value of a threshold parameter of the respective trigger condition.

BRIEF DESCRIPTION OF THE DRAWINGS

The foregoing aspects and other features of the method of approximating an optimal charging profile for a particular battery are explained in the following description, taken in connection with the accompanying drawings.

DETAILED DESCRIPTION

Figure 1:
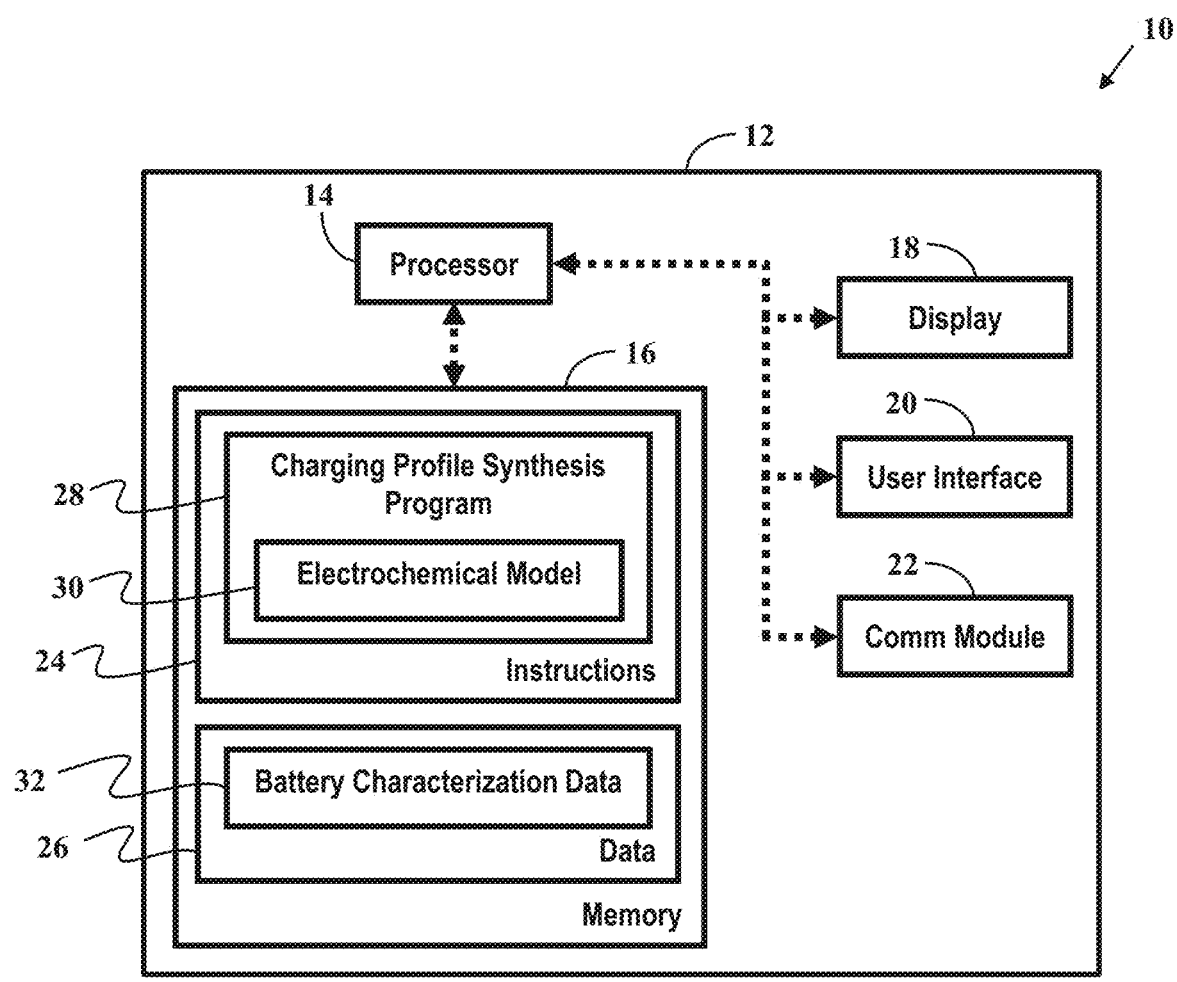
FIG. 1 shows a block diagram of an exemplary embodiment of a computing system for determining a pseudo-optimal charging algorithm for a specific battery.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art to which this disclosure pertains.

An electrochemical battery model based battery management system (BMS) provides a pathway for the most efficient utilization of Li-ion batteries by utilizing model equations that reflect the physical behavior inside of the battery. Particularly, the equations, and the like, of an electrochemical battery model can be designed to accurately capture all of the relevant mechanisms that lead to aging or other undesirable processes, such as (but not limited to) lithium plating, battery swelling, solid-electrolyte interphase (SEI) layer growth, or gas generation due to electrolyte decomposition. Accordingly, an electrochemical battery model can be used to accurately identify boundary conditions for efficient utilization of batteries and, thus, can be used to improve charging speed while minimizing aging and other undesirable processes.

However, the utilization of an electrochemical battery model in a BMS faces certain challenges. First, the performance of the BMS in terms of accurate state of charging estimation, power prediction and online strategies for fast charging is directly related to the quality of the model parameters in the initial model and the adaptation of the model parameters as the battery ages. However, validating results of algorithms that estimate electrochemical battery model parameters is a time consuming process that requires specific experimental techniques. Second, algorithms for state and parameter estimation based on electrochemical battery models are computationally intensive for real time implementation because such models would likely involve coupled nonlinear Partial Differential Equations (PDE) that are solved numerically by model reduction techniques with algebraic constraints. Finally, in order to get the full benefit of using an electrochemical battery model based BMS for fast charging strategies, it is imperative to adapt the model parameters as the battery ages.

The development, implementation, and validation of such algorithms are typically challenging and remain unsolved for online deployment in products. Disclosed herein is method and system that maintains the same benefits of an electrochemical battery model for fast charging applications while utilizing simpler and easier to implement building blocks for charging profile generation, as well as adaptation rules that guarantee safe and efficient operation of the battery during charging. As discussed in greater detail below, a complex electrochemical battery model is used offline to determine an optimal charging profile for a specific battery and the optimal charging profile is systematically and closely approximated using functional building blocks which can be easily implemented in embedded applications with constrained memory and processing capabilities.

System for Synthesizing a Pseudo-Optimal Charging Profile

FIG. 1 shows a block diagram of an exemplary embodiment of a computing system 10 for determining a pseudo-optimal charging profile for a specific battery. The computing system 10 is typically provided in a housing, cabinet, or the like 12 that is configured in a typical manner for a computing device. In the illustrated embodiment, the computing system 10 includes a processor 14, memory 16, a display 18, a user interface 20, and a network communications module 22. It will be appreciated, however, that the illustrated embodiment of the computing system 10 is only one exemplary embodiment of a computing system 10 and is merely representative of any of various manners or configurations of a personal computer, laptop computer, server, or any other data processing systems that are operative in the manner set forth herein.

The processor 14 is configured to execute instructions to operate the computing system 10 to enable the features, functionality, characteristics and/or the like as described herein. To this end, the processor 14 is operably connected to the memory 16, display 18, the user interface 20, and the network communications module 22. The processor 14 generally comprises one or more processors which may operate in parallel or otherwise in concert with one another. It will be recognized by those of ordinary skill in the art that a "processor" includes any hardware system, hardware mechanism or hardware component that processes data, signals, or other information. Accordingly, the processor 14 may include a system with a central processing unit, multiple processing units, or dedicated circuitry for achieving specific functionality.

The memory 16 may be of any type of device capable of storing information accessible by the processor 14, such as a memory card, ROM, RAM, write-capable memories, read-only memories, hard drives, discs, flash memory, or any of various other computer-readable medium serving as data storage devices as will be recognized by those of ordinary skill in the art. The memory 16 is configured to store program instructions 24 for execution by the processor 14, as well as data 26. The program instructions 24 at least include a charging profile synthesis program 28. The charging profile synthesis program 28 includes at least some instructions corresponding to at least one electrochemical battery model 30. In at least one embodiment, the data 26 includes battery characterization data 32 corresponding to at least one specific battery. The charging profile synthesis program 28 is configured to enable the computing system 10 to determine an optimal charging profile for the at least one specific battery using the at least one electrochemical battery model 30 and the battery characterization data 32 for the at least one specific battery. The charging profile synthesis program 28 is configured to further enable the computing system 10 to synthesis a pseudo-optimal charging profile comprised of a sequence of functional building blocks, which closely approximates the optimal charging profile.

The network communication module 22 of the computing system 10 provides an interface that allows for communication with any of various devices using various means and may comprise one or more modems, transceivers, network adapters, or the like. In particular, the network communications module 22 may include a local area network port that allows for communication with any of various local computers housed in the same or nearby facility. In some embodiments, the network communications module 22 further includes a wide area network port that allows for communications with remote computers over the Internet. Alternatively, the computing system 10 communicates with the Internet via a separate modem and/or router of the local area network. In one embodiment, the network communications module is equipped with a Wi-Fi transceiver or other wireless communications device. Accordingly, it will be appreciated that communications with the computing system 10 may occur via wired communications or via the wireless communications. Communications may be accomplished using any of various known communications protocols.

The computing system 10 may be operated locally or remotely by a user. To facilitate local operation, the computing system 10 may include the display 18 and the user interface 20. Via the user interface 20, a user may access the instructions, including the charging profile synthesis program 28, and may collect data from and store data to the memory 16. In at least one embodiment, the display 18 may include an LCD display screen or the like. In at least one embodiment, the user interface 20 may suitably include a mouse or other pointing device, a keyboard or other keypad, speakers, and a microphone, as will be recognized by those of ordinary skill in the art. It will be appreciated that the display 18 and the user interface 20 may be integrated on or within the housing 12 or may be external devices which are operably connected via a connector arranged on the housing 12 (not shown). Alternatively, in some embodiments, a user may operate the computing system 10 remotely from another computing device which is in communication therewith via the network communication module 22 and has an analogous display and user interface.

Charging Profile Synthesis Program

Methods for operating the computing system 10 are described below. In particular, methods of operating the processor 14 to determine a pseudo-optimal charging algorithm for a specific battery are described. In the description of the methods, statements that a method is performing some task or function refers to a general purpose processor or the like (e.g., the processor 14) executing programmed instructions (e.g. the charging profile synthesis program 28 and/or the electrochemical battery model 30) stored in non-transitory computer readable storage media (e.g., the memory 16) operatively connected to the controller or processor to manipulate data or to operate one or more components in the computing system 10 to perform the task or function. It will be appreciated that some or all of the operations in the method can also be performed by a remote server or cloud processing infrastructure. Additionally, the steps of the methods may be performed in any feasible chronological order, regardless of the order shown in the figures or the order in which the steps are described.

Figure 2:
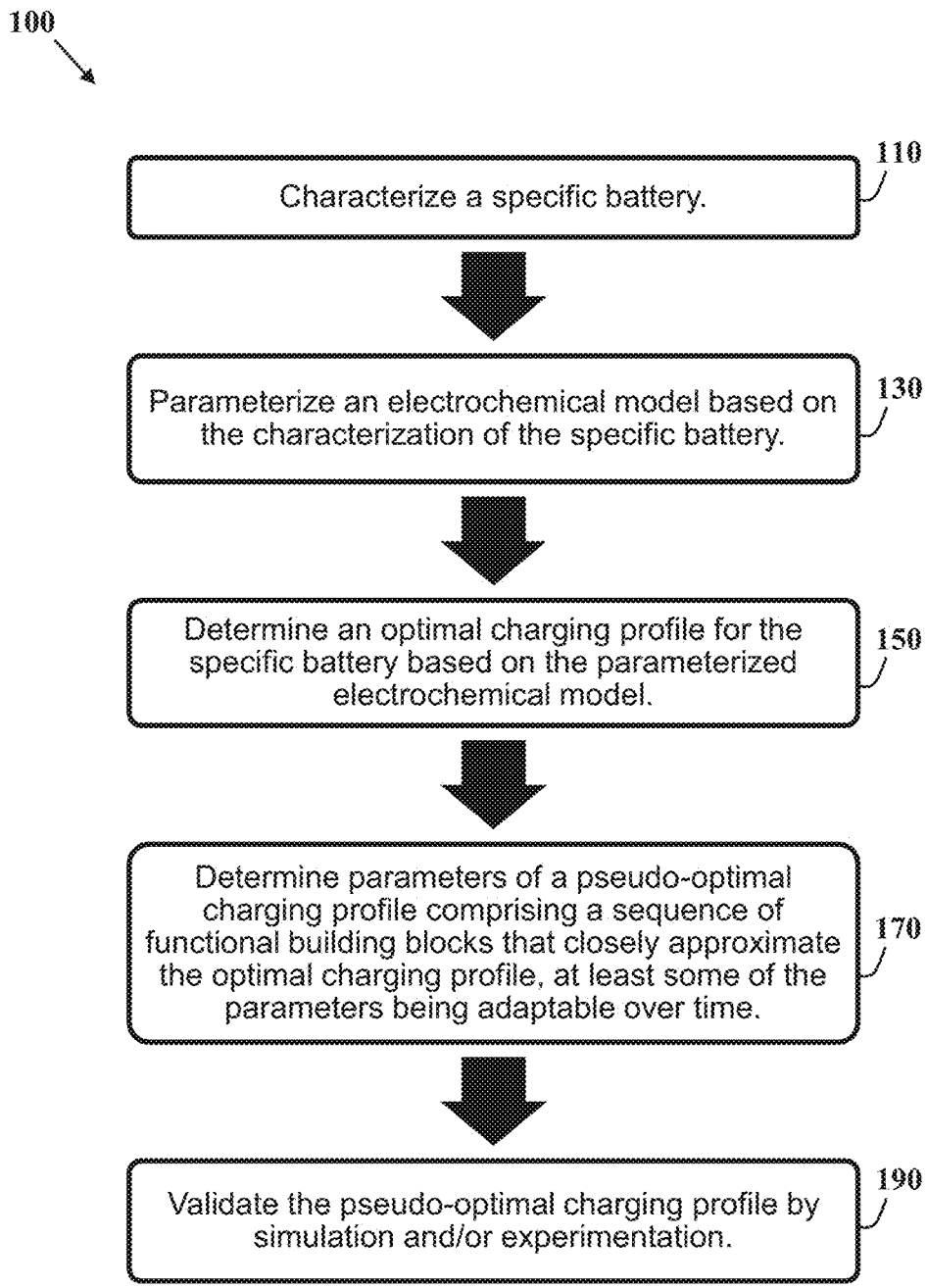
FIG. 2 shows a logical flow diagram for a method for determining a pseudo-optimal charging algorithm for a specific battery.

FIG. 2 shows a logical flow diagram for a method 100 for determining a pseudo-optimal charging algorithm for a specific battery. The method 100 improves upon the functioning of the computing system 10 and, more particularly, the functioning of the processor 14 of the computing system 10, by advantageously enabling the processor 14 to determine an optimal charging profile for a specific battery, and to systematically derive a pseudo-optimal charging profile comprised of a sequence of functional building blocks, which closely approximates the optimal charging profile and are adapted over time as the battery ages. As will be discussed in greater detail below, once derived, the pseudo-optimal charging profile can be used to improve upon the functioning of a charging circuit or battery management system of a device which employs the specific battery by enabling faster charging and/or minimizing degradation and other undesirable processes.

The method 100 begins with steps of characterizing a specific battery for which a pseudo-optimal charging profile is to be determined (block 110) and, once the battery has been characterized, parameterizing the electrochemical battery model based on the characterization of the specific battery (block 130). Particularly, with respect to the detailed embodiments described herein, the computing system 10 is configured to receive, measure, or otherwise acquire characteristic data regarding a specific battery. In at least one embodiment, the specific battery is a specific lithium-ion battery. The processor 14 is configured to store the characteristic data regarding the specific battery in the memory 16 (referred to herein as the battery characterization data 32).

Electrical and electrochemical tests are performed on the specific battery to parameterize the physics-based electrochemical battery model 30. In some embodiments, one such electrical test comprises a series of slow charge and discharge steps to characterize a capacity of the specific battery, as well as other parameters relating to steady state battery behavior. In further embodiments, additional electrical tests involving different charge, discharge rates, current pulses of varying duration and magnitude at different temperatures are used to obtain data to fit dynamic and kinetic parameters of the electrochemical battery model 30.

The characteristic data 32 derived from the electrical tests may include information such as current-voltage-temperature profiles, open circuit voltage-state of charge measurements, energy capacity measurements, impedance measurements, and swelling measurements. The characteristic data 32 may include values of such parameters as a function of another parameter (e.g., as a function of battery voltage, battery current, state of charge, or time). In some embodiments, further characteristic data 32 may be manufacturer specification information that is defined by the manufacturer and published in documentation for to the specific battery, such as steady state and dynamic current limits, steady state and dynamic voltage limits, safe operational temperature ranges, nominal voltages, nominal capacities, and geometric and material properties.

In some embodiments, the processor 14 is configured to receive some or all of the characteristic data 32 regarding the specific battery via a data port which operably connects to a measurement tool, sensor, or the like, which is operated to measure some or all of the characteristic data 32 regarding the specific battery. In some embodiments, the processor 14 is configured to read some of the characteristic data 32 from a data file stored on the memory 16. In some embodiments, the processor 14 is configured to receive some or all of the characteristic data 32 regarding the specific battery from another computing device via the network communication module 22. In some embodiments, the processor 14 is configured to receive some of the characteristic data regarding the specific battery as inputs manually entered by a user via the user interface 20.

The processor 14 is configured to determine values of undefined parameters of the electrochemical battery model 30 based on the characteristic data 32. Particularly, the electrochemical battery model 30 comprises one or more equations that model a plurality of physical quantities and phenomena with respect to a battery, such as battery voltage, battery current, battery temperature, battery state of charge, lithium-ion flux, concentration of solid phase and electrolyte, and electrical potential in solid phase and electrolyte. The equations of the electrochemical battery model 30 are designed to capture the primary electrochemical reactions that characterize operation of the battery, as well as all of the relevant mechanisms that lead to aging or other undesirable processes, such as (but not limited to) lithium plating, battery swelling, solid-electrolyte interphase (SEI) layer growth, or gas generation due to electrolyte decomposition. The equations of the electrochemical battery model 30 include one or more undefined/unknown parameters that vary depending on the specific battery to be modeled. In at least one embodiment, the processor 14 is configured to determine the undefined parameters of the electrochemical battery model 30 through an optimization routine that attempts to minimize the difference between the experimental battery measurements (e.g., voltage, current, temperature, etc.) and corresponding model based predictions.

Figure 3:
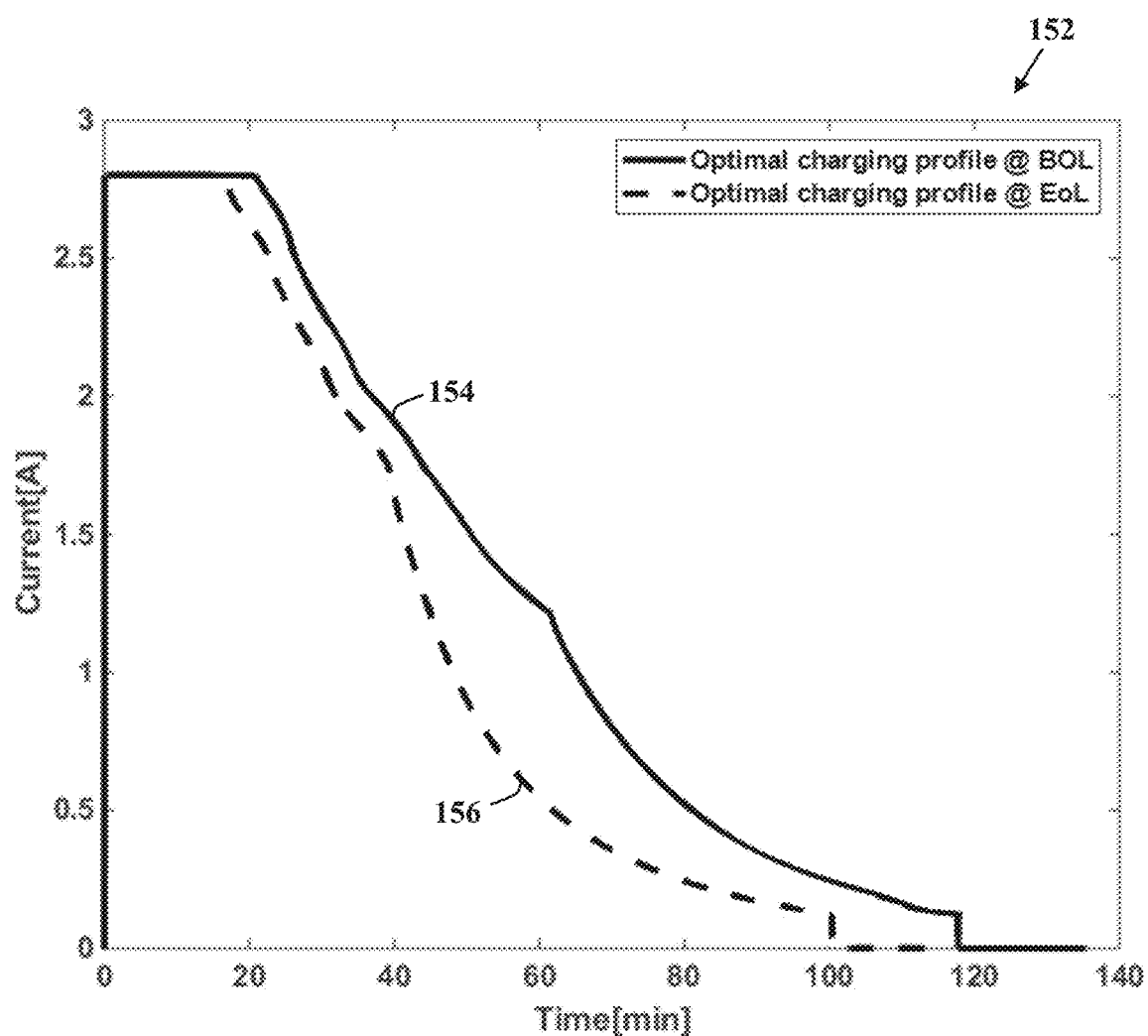
FIG. 3 shows a plot illustrating optimal charging profiles for an exemplary lithium-ion battery at the beginning of life and at the end of life.

Once the electrochemical battery model has been parameterized for the specific battery, the method 100 continues with a step of determining an optimal charging profile for the specific battery based on the parameterized electrochemical battery models (block 150). Particularly, with respect to the detailed embodiments described herein, the processor 14 is configured to determine an optimal charging profile that minimizes a charging time for the particular battery and minimizes a degradation/aging of the particular battery using the electrochemical battery model 30. As used herein, the term "charging profile" is a data plot, a plurality of parameters, values, or data points, one or more functions or equations, or the like, which defines battery current, battery voltage, and/or battery state of charge of a battery over time and/or as a function of time during at least a portion of a charging process in which current flows into the battery. The processor 14 is configured to calculate an optimal charging profile for the specific battery which minimizes charging time by maximizing input charge current to the battery, while under the constraints of current limits and voltage limits specified by the manufacturer of the battery and while minimizing side reactions that could potentially cause lithium plating or otherwise age the battery faster. In one embodiment, the relative importance/priority of minimizing charging time and minimizing degradation/aging can be weighted based on a user input. In some embodiments, the processor 14 is further configured to calculate a plurality of additional optimal charging profiles as the battery ages using an optimal electrochemical profile at beginning of life (BoL) in a closed loop environment until the battery reaches its end of life (EoL). Particularly, the processor 14 is configured to calculate a set of N optimal charging profiles in which each optimal charging profile corresponds to a different level of degradation/age of the specific battery. FIG. 3 shows a plot 152 illustrating optimal charging profiles 154 and 156 for an exemplary lithium-ion battery. The charging profile 154 (shown with a solid line) represents the optimal charging profile for the exemplary lithium-ion battery at the beginning of life. The charging profile 156 (shown with a dashed line) represents the optimal charging profile for the exemplary lithium-ion battery at the end of life.

Returning to FIG. 2, once the optimal charging profile has been determined, the method 100 continues with a step of determining a pseudo-optimal charging profile comprising a sequence of functional building blocks, which closely approximates the optimal charging profile (block 170). Particularly, as mentioned before, the optimal charging profile derived from an electrochemical battery model 30 can be approximated using simple building blocks. The processor 14 is configured to determine at least one pseudo-optimal charging profile which is formed by an ordered sequence of charging profile building blocks which closely approximates the optimal charging profile(s). More particularly, the processor 14 is configured to determine a set of parameters that defines and/or characterizes an ordered sequence of charging profile building blocks that forms the pseudo-optimal charging profile. In at least some embodiments, adaptation rules for providing a plurality of different pseudo-optimal charging profiles as the battery ages.

As used herein a "charging profile building block" (which may also be referred to herein as a "charging phase," a "functional building block," a "functional block," a "simple building block," and/or a "building block") refers to a segment or portion of a charging profile which is characterized by (i) a particular control strategy that is used to regulate a charging current applied to a battery and (ii) a particular trigger condition that is used to end the particular segment or portion of the charging profile and either transition to a next charging profile building block or, in the case of the last charging profile building block in a sequence, end the charging process. The particular control strategy of a charging profile building block is performed with respect to at least one control parameter having a defined target value. Likewise, the particular trigger condition (which may also be referred to here as a switching criterion) of a charging profile building block is evaluated with respect to at least one threshold parameter having a defined threshold value. In at least some embodiments, the control parameter and threshold parameter of each charging profile building block adapted as a function the state of health of the battery, or of some other parameter of the battery which is indicative of the state of health, such that the control parameter and threshold parameter are adapted over time. The optimal charging profile can be closely approximated by a sequence of such charging profile building blocks, which is referred to herein as a "pseudo-optimal charging profile."

In at least one embodiment, each charging profile building block of a pseudo optimal charging profile is characterized by at least four different parameters. A first parameter (also referred to herein as the "control strategy") indicates a respective control strategy that is to be used to control a charging current during the respective building block. Exemplary control strategies include (but are not limited to) constant current (CC), constant current ramp (CdI), constant voltage (CV), and constant voltage ramp (CdV). A second parameter (also referred to herein as the "control parameter") indicates a value of a control parameter of the respective control strategy, such as a target current magnitude, a target rate of change of current, a target voltage magnitude, and a target rate of change of voltage. A third parameter (also referred to herein as the "trigger condition") indicates a respective type of trigger condition which, when satisfied, is to cause the respective building block to end. Exemplary trigger conditions include (but are not limited to) a current-based trigger condition, a voltage-based trigger condition, a state of charge-based trigger condition, a temperature-based trigger condition, and a time duration-based trigger condition. Finally, a fourth parameter (also referred to herein as the "threshold parameter") indicates a value of a threshold parameter of the respective trigger condition, such as a current threshold parameter, a voltage threshold parameter, a state of charge threshold parameter, a temperature threshold parameter, and a time duration threshold parameter. Exemplary combinations of these control strategies and trigger conditions used in the charging profile building blocks are summarized below in Table 1.

TABLE 1

| Control Strategy | Control Parameter | Trigger Condition | Threshold Parameter |
|---|---|---|---|
| Constant Current (CC) | Current magnitude ($CC_{Mag}$) | a) Voltage-based trigger<br>b) SOC-based trigger<br>c) Temperature-based trigger<br>d) Time trigger | a) Voltage threshold ($V_{trigger}$)<br>b) SOC threshold ($SOC_{trigger}$)<br>c) Temperature threshold ($T_{trigger}$)<br>d) Time duration threshold ($t_{trigger}$) |
| Constant Current Ramp (CdI) | Current slope ($CdI_{Mag}$) | a) Voltage-based trigger<br>b) SOC-based trigger<br>c) Temperature-based trigger<br>d) Time-based trigger | a) Voltage threshold ($V_{trigger}$)<br>b) SOC threshold ($SOC_{trigger}$)<br>c) Temperature threshold ($T_{trigger}$)<br>d) Time duration threshold ($t_{trigger}$) |
| Constant Voltage (CV) | Voltage magnitude ($CV_{Mag}$) | a) Current-based trigger<br>b) SOC-based trigger<br>c) Temperature-based trigger<br>d) Time-based trigger | a) Current threshold ($I_{trigger}$)<br>b) SOC threshold ($SOC_{trigger}$)<br>c) Temperature threshold ($T_{trigger}$)<br>d) Time duration threshold ($t_{trigger}$) |
| Constant Voltage Ramp (CdV) | Voltage slope ($CdV_{Mag}$) | a) Current-based trigger<br>b) SOC-based trigger<br>c) Temperature-based trigger<br>d) Time-based trigger | a) Current threshold ($I_{trigger}$)<br>b) SOC threshold ($SOC_{trigger}$)<br>c) Temperature threshold ($T_{trigger}$)<br>d) Time duration threshold ($t_{trigger}$) |

In functional blocks utilizing a constant current control strategy, the battery charging current is held at a constant value defined by the current magnitude control parameter $CC_{Mag}$ until a corresponding trigger condition is satisfied. In functional blocks utilizing a constant current ramp control strategy, the battery charging current monotonically increased or decreased with a constant slope defined by a current slope control parameter $CdI_{Mag}$ until a corresponding trigger condition is satisfied. In functional blocks utilizing a constant voltage control strategy, the battery charging current is regulated so as to hold the battery voltage at a constant value defined by the voltage magnitude control parameter $CV_{Mag}$ until a corresponding trigger condition is satisfied. In functional blocks utilizing a constant voltage ramp control strategy, the battery charging current regulated so as to monotonically increase or decrease the battery voltage with a constant slope defined by a voltage slope control parameter $CdV_{Mag}$ until a corresponding trigger condition is satisfied.

In functional blocks utilizing a voltage trigger condition, the control strategy of the respective functional block is ended in response to the battery voltage exceeding (or falling below, in some cases) a value defined by the voltage threshold parameter $V_{trigger}$. In functional blocks utilizing a current trigger condition, the control strategy of the respective functional block is ended in response to the battery current falling below (or exceeding, in some cases) a value defined by the current threshold parameter $I_{trigger}$. In functional blocks utilizing a state of charge (SOC) trigger condition, the control strategy of the respective functional block is ended in response to the state of charge (SOC) of the battery exceeding a value defined by the state of charge (SOC) threshold parameter $SOC_{trigger}$. In functional blocks utilizing a temperature trigger condition, the control strategy of the respective functional block is ended in response to the temperature of the battery exceeding (or falling below, in some cases) a value defined by the temperature threshold parameter $T_{trigger}$. In functional blocks utilizing a time trigger condition, the control strategy of the respective functional block is ended in response to the time since beginning the functional block exceeding a value defined by the time duration threshold parameter $t_{trigger}$.

In order to minimize battery degradation, it is crucial to adapt the control parameters (the second parameter, discussed above) and threshold parameters (the fourth parameter, discussed above) of the charging profile building blocks in accordance with battery temperature and/or battery degradation/age. Accordingly, in at least one embodiment, the processor 14 is further configured to calculate optimal values for parameters of a plurality of adaptation functions that are used to adjust the values for the control parameter and the threshold parameter of each charging profiles functional block, as a function of battery temperature and/or battery degradation/age.

Below we describe exemplary adaptation functions for the control parameters of each exemplary charge control strategy and exemplary adaptation functions for the threshold parameters of each exemplary trigger condition. The exemplary adaptation functions $f_1$-$f_9$ are summarized below in Table 2.

TABLE 2

| Control Parameter and Threshold Parameter for a Charging Profile Building Block | Adaptation rule |
|---|---|
| Current magnitude for constant-current control strategy | $CC_{Mag} = f_1(CC_{adapt}, SOH, T)$ |
| Current slope for constant-current ramp control strategy | $CdI_{Mag} = f_2(CdI_{adapt}, SOH, T)$ |
| Voltage magnitude for constant-voltage control strategy | $CV_{Mag} = f_3(CV_{adapt}, SOH, T)$ |
| Voltage slope for constant-voltage ramp control strategy | $CdV_{Mag} = f_4(CdV_{adapt}, SOH, T)$ |

TABLE 2-continued

| Control Parameter and Threshold Parameter for a Charging Profile Building Block | Adaptation rule |
|---|---|
| Voltage threshold for voltage-based trigger condition | $V_{trigger} = f_5(V_{adapt}, SOH)$ |
| Current threshold for current-based trigger condition | $I_{trigger} = f_6(I_{adapt}, SOH)$ |
| SOC threshold for SOC-based trigger condition | $SOC_{trigger} = f_7(SOC_{adapt}, SOH)$ |
| Temperature threshold for temperature-based trigger condition | $T_{trigger} = f_8(T_{adapt}, SOH)$ |
| Time duration threshold for time-based trigger condition | $t_{trigger} = f_9(t_{adapt}, SOH)$ |

As described in Table 2, the constant-current magnitude parameter $CC_{Mag}$ is defined as an arbitrary function $f_1$, which depends on a battery temperature T, a battery state of health SoH, and one or more arbitrary constant current magnitude adaptation parameters $CC_{adapt}$. The current slope parameter $CdI_{Mag}$ is defined as an arbitrary function $f_2$, which depends on a battery temperature T, a battery state of health SoH, and one or more arbitrary current slope adaptation parameters $CdI_{adapt}$. The constant-voltage magnitude parameter $CV_{Mag}$ is defined as an arbitrary function $f_3$, which depends on a battery temperature T, a battery state of health SoH, and one or more arbitrary constant voltage magnitude adaptation parameters $CV_{adapt}$. Finally, the voltage slope parameter $CdV_{Mag}$ is defined as an arbitrary function $f_4$, which depends on a battery temperature T, a battery state of health SoH, and one or more arbitrary voltage slope adaptation parameters $CdV_{adapt}$.

Similarly, the voltage threshold parameter $V_{trigger}$ is defined as an arbitrary function $f_5$, which depends on the battery state of health SoH and one or more arbitrary voltage threshold adaptation parameters $V_{adapt}$. The current threshold parameter $I_{trigger}$ is defined as an arbitrary function $f_6$, which depends on the battery state of health SoH and one or more arbitrary current threshold adaptation parameters $I_{adapt}$. The state of charge threshold parameter $SOC_{trigger}$ is defined as an arbitrary function $f_7$, which depends on the battery state of health SoH and one or more arbitrary state of charge threshold adaptation parameters $SOC_{adapt}$. The temperature threshold parameter $T_{trigger}$ is defined as an arbitrary function $f_8$, which depends on the battery state of health SoH and one or more arbitrary temperature threshold adaptation parameters $T_{adapt}$. Finally, the time duration threshold parameter $t_{trigger}$ is defined as an arbitrary function $f_9$, which depends on the battery state of health SoH and one or more arbitrary time duration threshold adaptation parameters $t_{adapt}$.

The adaptation functions $f_1$-$f_9$ may be pre-defined and stored in the memory 16. Exemplary adaptation functions for adapting a parameter as a function of the battery state of health SoH and one or more adaptation parameters $K_{adapt}$ may take the form of exemplary equation (1):

$$\text{Adapted Parameter} = f(K_{adapt}, SOH) = K_{initial} * f(K_{scale}, SOH) \quad (1),$$

where the one or more adaptation parameters $K_{adapt}$ includes a magnitude variable $K_{initial}$ indicating a value of the parameter at the beginning of life of the specific battery and a scaling parameter $K_{scale}$ which is used to scale the parameter depending on the battery state of health SoH. The battery state of health SoH may be defined in a conventional manner as a function of capacity, nominal capacity, impedance, nominal impedance, and the like. It will be appreciated that the adaptation functions $f_1$-$f_9$ may take many different forms, depending on parameter being adapted, and may incorporate features of an equivalent circuit battery model or the like. Additionally, as seen above, some adaptation functions for may further depend on the battery temperature T.

The processor 14 is configured to calculate, for each charging profile building block in the ordered sequence, a value of the respective control parameter (e.g., $CC_{Mag}$, $CdI_{Mag}$, $CV_{Mag}$, or $CdV_{Mag}$) and a value of the respective threshold parameter (e.g., $V_{trigger}$, $I_{trigger}$, $SOC_{trigger}$, $T_{trigger}$, or $t_{trigger}$) that (i) minimizes a difference between the optimal charging profile and the pseudo optimal charging profile and (ii) minimizes a difference between a degradation/aging of the specific battery caused by the optimal charging profile and a degradation/aging of the specific battery caused by the pseudo optimal charging profile, at least with respect to the optimal charging profile at a beginning of life (i.e., the optimal charging profile corresponding to a least amount of degradation).

Furthermore, the processor 14 is configured to calculate values of adaptation parameters of the adaptation functions (e.g., $CC_{adapt}$, $CdI_{adapt}$, $CV_{adapt}$, or $CdV_{adapt}$, and $V_{adapt}$, $I_{adapt}$, $SOC_{adapt}$, $T_{adapt}$, or $t_{adapt}$) used to adapt control parameters and threshold parameters for each charging profile building in the ordered sequence of the optimal charging profiles past the beginning of life, that (i) minimize differences between each optimal charging profile and the correspondingly adapted pseudo optimal charging profile at each amount of degradation and (ii) minimize differences between a degradation/aging of the specific battery caused by each optimal charging profile and a degradation/aging of the specific battery caused by the correspondingly adapted pseudo optimal charging profile at each amount of degradation.

Thus, the processor 14 is configured to, for each charging profile building block, at least determine initial values for the control parameter $CC_{Mag}$, $CdI_{Mag}$, $CV_{Mag}$, or $CdV_{Mag}$ and the threshold parameter $V_{trigger}$, $I_{trigger}$, $SOC_{trigger}$, $T_{trigger}$, or $t_{trigger}$ and determine values for corresponding adaptation parameters $CC_{adapt}$, $CdI_{adapt}$, $CV_{adapt}$, or $CdV_{adapt}$, and $V_{adapt}$, $I_{adapt}$, $SOC_{adapt}$, $T_{adapt}$, or $t_{adapt}$ that are used to adapt the control parameters and the threshold parameters, respectively, as the specific battery ages and/or degrades.

In at least one embodiment, the processor 14 is configured to calculate control parameters and threshold parameters for each charging profile building block, as well as the adaptation parameters of the adaptation functions by solving a minimization and/or optimization problem. For example, given a set of optimal charging profiles over N cycles, one can decide which types of building blocks (i.e., which control strategies and trigger conditions) to use to form pseudo optimal charging profiles that approximates the optimal charging profiles. The selection of control strategies and trigger conditions for each block is discussed in further detail below. Once the sequence of building blocks is fixed (the same sequence is used for all cycles), the following minimization equation (2) can be imposed to calculate the optimal values for the control parameters, threshold parameters, and adaptation parameters as function of current, voltage, temperature, state of charge, state of health, capacity, impedance, etc:

$$\text{Min} \sum_{l=1,2,\ldots,N} \Sigma_k \|A_{l,k} - \widehat{A_{l,k}}\| + \|I_l - \widehat{I_l}\| \qquad (2).$$

In the equation (2), l denotes cycle number out of the N cycles, $A_{l,k}$ denotes an aging indicator k at cycle l in an optimal profile, $\widehat{A_{l,k}}$ denotes the aging indicator k at cycle l in a pseudo optimal profile, $I_l$ represents the optimal charging profile in cycle l, and $\widehat{I_l}$ represents the pseudo optimal charging profile in cycle l. The equation (2) is solved to determine optimized values for the control parameters, threshold parameters, and the adaption parameters. The minimization problem of equation (2) is subject to current, voltage and temperature limits specified by a manufacturer of the specific battery. We note that aging indicators $A_{l,k}$ are representations of over potential of undesired side reactions that cause capacity loss and battery aging and are related to the internal states of the electrochemical battery model. Such side reactions embodied by the aging indicators $A_{l,k}$ include (but are not limited to) lithium plating, battery swelling, solid-electrolyte interphase (SEI) layer growth, or gas generation due to electrolyte decomposition. The equation (2) guarantees the best approximation of optimal electrochemical charging profile such that pseudo optimal profiles have a very similar aging behavior over lifetime of the battery.

As discussed above, in at least one embodiment, the processor 14 is configured to determine the control parameters and the threshold parameters for each charging profile building block, as well as the adaptation parameters used to adjust the control parameters and the threshold parameters. In some embodiments, the type of control strategy and trigger condition used for each charging profile building block are pre-defined or pre-selected prior to determining the control parameters, the threshold parameters, and the adaptation parameters.

Particularly, in some embodiments, the processor 14 is configured to receive, via an input device such as the user interface 20 or the network communications module 22, for each building block in the ordered sequence that forms the pseudo optimal charging profile, a value of the first parameter which indicates the control strategy to be used for the respective building block and a value of the third parameter which indicates the trigger condition to be used for the respective building block. The first parameter for each building block in the ordered sequence that forms the pseudo optimal charging profile may, for example take, the possible values: CC, CdI, CV, or CdV. Similarly, the third parameter for each building block in the ordered sequence that forms the pseudo optimal charging profile may, for example, take the possible values: V_TRIG, I_TRIG, SOC_TRIG, TEMP_TRIG, or TIME_TRIG.

However, the optimization process, embodied in the equation (2) discussed above, can be generalized and/or adapted to also identify the optimal values of the third parameter which indicates the type of trigger condition to be used for each respective building block. Particularly, in some embodiments, the processor 14 is configured to jointly determine values of the respective third parameter, which indicates the type of trigger condition to be used for each respective building block, that (i) minimize differences between the optimal charging profile and the pseudo optimal charging profile and (ii) minimize differences between a degradation/aging of the specific battery caused by the optimal charging profile and a degradation/aging of the specific battery caused by the pseudo optimal charging profile. An example of this approach is provided below in Table 3.

TABLE 3

| Threshold Parameter for Trigger Condition | Identification of Trigger Condition and Threshold Adaptation Rule |
|---|---|
| Voltage threshold for voltage-based trigger condition | $V_{trigger} = \text{flag}_V * f_5(V_{adapt}, \text{SOH})$ |
| Current threshold for current-based trigger condition | $I_{trigger} = \text{flag}_I * f_6(I_{adapt}, \text{SOH})$ |
| SOC threshold for SOC-based trigger condition | $SOC_{trigger} = \text{flag}_{SOC} * f_7(SOC_{adapt}, \text{SOH})$ |
| Temperature threshold for temperature-based trigger condition | $T_{trigger} = \text{flag}_T * f_8(T_{adapt}, \text{SOH})$ |
| Time duration threshold for time-based trigger condition | $t_{trigger} = \text{flag}_t * f_9(t_{adapt}, \text{SOH})$ |

In Table 3, the trigger condition flags $\text{flag}_V$, $\text{flag}_I$, $\text{flag}_{SOC}$, $\text{flag}_T$, and $\text{flag}_t$ take values from the set $\{0,1\}$. If a particular trigger condition flag has the value 1, then the corresponding trigger condition is used for the respective charging profile building block. Conversely, if a particular trigger condition flag has the value 0, then the corresponding trigger condition is not used for the respective charging profile building block. In some embodiments, the processor 14 is configured to utilized these functions, or similar, in combination with the equation (2) to determine optimal values for the trigger condition flags $\text{flag}_V$, $\text{flag}_I$, $\text{flag}_{SOC}$, $\text{flag}_T$, and $\text{flag}_t$, and thus an optimal value for the third parameter which indicates the particular type of trigger condition to be used for the respective building block. In one embodiment, the optimization process is performed with the constraint that only one of the trigger condition flags $\text{flag}_V$, $\text{flag}_I$, $\text{flag}_{SOC}$, $\text{flag}_T$, and $\text{flag}_t$ may have a value 1. In this way, the third parameters, which indicates the type of trigger condition to be used for each building block, can be determined jointly with the control parameters, the threshold parameters, and the adaptation parameters, as discussed above.

Similarly, the optimization process, embodied in the equation (2) discussed above, can be further generalized and/or adapted to also identify the optimal values of the first parameter, which indicates the control strategy to be used for each respective building block, as well as to determine an optimal number of different building blocks in the sequence. Particularly, in some embodiments, the processor 14 is further configured to jointly determine values of the respective first parameter, which indicates the control strategy to be used for each respective building block, that (i) minimize differences between the optimal charging profile and the pseudo optimal charging profile and (ii) minimize differences between a degradation/aging of the specific battery caused by the optimal charging profile and a degradation/aging of the specific battery caused by the pseudo optimal charging profile.

With continued reference to FIG. 2, once the pseudo-optimal charging profile is determined, the method 100 continues with a step of validating the pseudo-optimal charging profile by simulation and/or experimentation (block 190). Particularly, with respect to the detailed embodiments described herein, the processor 14 is configured to compare the optimal charging profile and the pseudo optimal charging profile at different amounts of degradation in order to validate the pseudo optimal charging profile. Furthermore, in some embodiments, the processor 14 is configured to perform simulations using the electrochemical battery model 30 using the optimal charging profile and the pseudo optimal charging profile and compare various performance metrics, such as charging time, speed of degradation, and the like. In some embodiments, the processor 14 is configured to operate the display 18 to display a visual comparison of the optimal charging profile and the pseudo optimal charging profile, or a visual comparison of certain performance metrics for evaluation by a user. In some embodiments, the processor 14 is configured to similarly compare the pseudo optimal charging profile and the performance metrics thereof with OEM recommended charging schemes.

Figure 4:
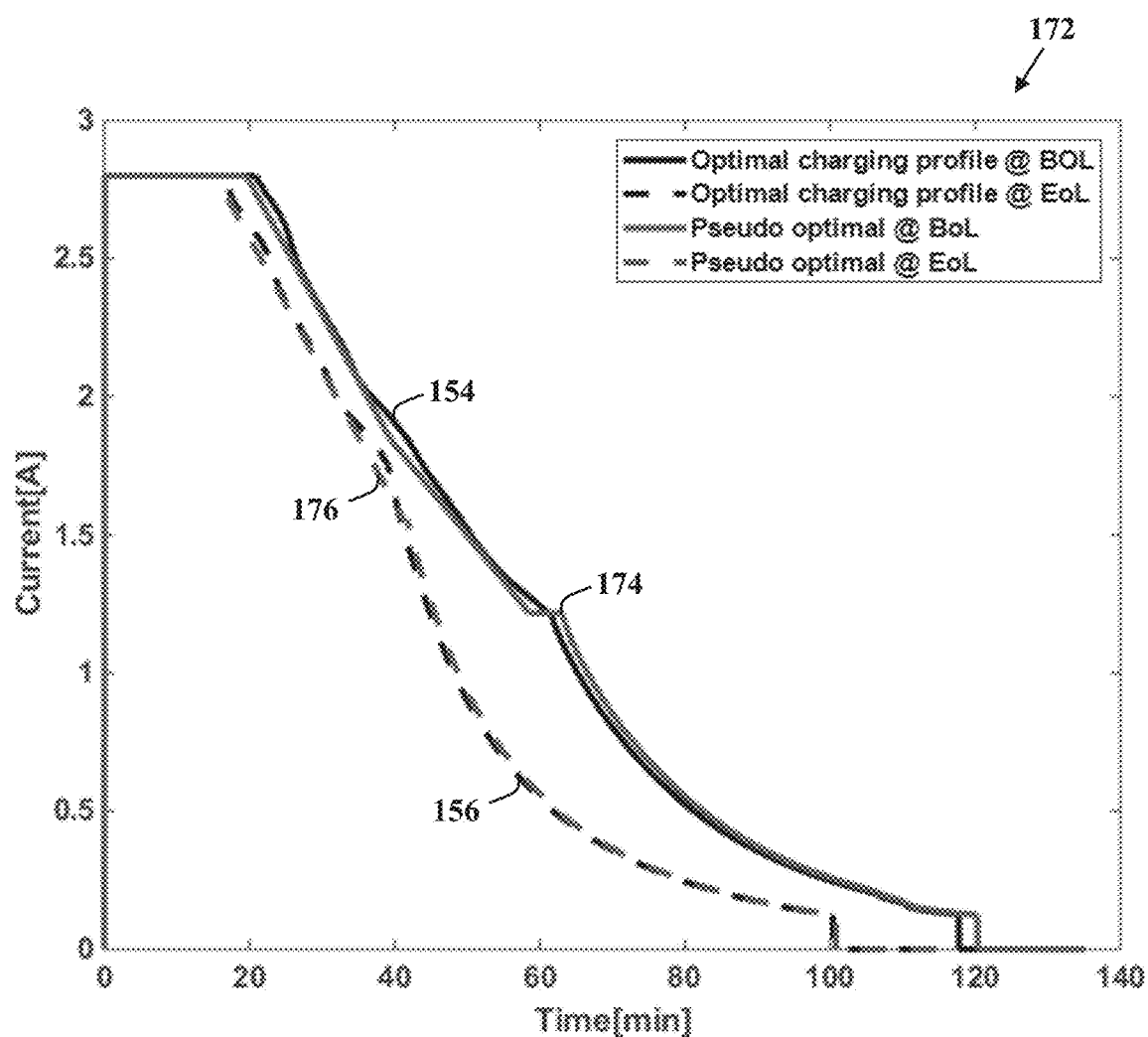
FIG. 4 shows a plot illustrating pseudo-optimal charging profiles for an exemplary lithium-ion battery at a beginning of life and at an end of life.

FIG. 4 shows a plot 172 illustrating a visual comparison of pseudo optimal charging profiles 174 and 176 and the optimal charging profiles 154 and 156 for the exemplary lithium-ion battery. The charging profile 174 (shown with a solid line) represents the determined pseudo optimal charging profile for the exemplary lithium-ion battery at the beginning of life. The charging profile 176 (shown with a dashed line) represents the determined pseudo optimal charging profile for the exemplary lithium-ion battery at the end of life. The charging profiles 174 and 176 are formed by an order sequence of charging phases including: (1) a first constant current phase, (2) a first current ramp phase, (3) a second current ramp phase, (4) a second constant current phase, and (5) a constant voltage phase. As can be seen, the pseudo optimal charging profiles 174 and 176 closely approximate the optimal charging profiles 154 and 156 determined using the electrochemical battery model 30.

Figure 5:
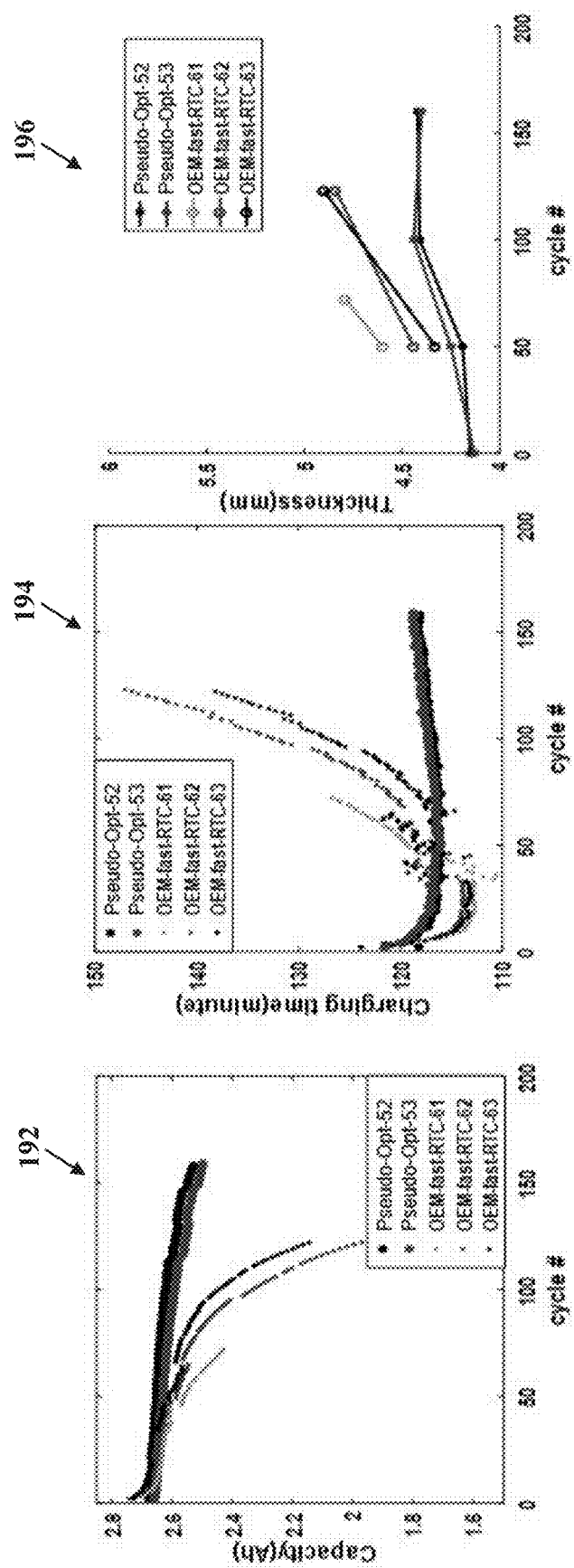
FIG. 5 shows experimental results comparing the performance of OEM suggested charging scheme with that of the pseudo-optimal charging profile for an exemplary lithium-ion battery.

Similarly, the pseudo-optimal charging profile can be validated by experimentation. Particularly, FIG. 5 shows experimental results comparing the performance of OEM suggested charging schemes with that of a pseudo-optimal charging profile for an exemplary lithium-ion battery. Particularly, an exemplary lithium-ion battery, an cellphone battery, was used to obtain these experimental results. Per manufacturer specifications, the cell has a nominal capacity of 2.8 Ah, maximum voltage of 4.4V and an OCP rating of 4.8 A. Additionally, per manufacturer specifications, the cell temperature shall not exceed 40 degree Celsius. The OEM suggested fast charge algorithm consists of a constant current of 3.105 A up to 4.3V, and then de-rating the current to 1.89 A up to 4.4V and keep the voltage at 4.4V until the current reaches 100 mA. This results in a charging time of approximately 125 minutes from 0% to 100% state of charge.

A pseudo-optimal charging profile was derived according the methods discussed above, with the goal to maintain a same charging time similar to the OEM suggested fast charge algorithm, while significantly improving the cycle life of the battery. Details of the pseudo-optimal charging profile derived for the cellphone battery are given below in Table 4.

TABLE 4

| Control Strategy | Control Parameter and Adaption rule | Trigger Condition | Threshold Parameter and Adaption rule |
|---|---|---|---|
| Constant Current | 3.105 [A] | SOC | 0.17 |
| Current Ramp | −12e−4 [A/s] | SOC | 0.36*nominal_capacity/capacity [A] |
| Current Ramp | −4e−4 [A/s] | Current | 1.2*nominal_capacity/capacity [A] |
| Constant Current | 1.2*nominal_capacity/capacity [A] | Voltage | 4.4 [V] |
| Constant Voltage | 4.4 V | Current | 0.120 [A] |

To compare the performance of pseudo optimal charging profile in relation to the OEM suggested charging scheme, the batteries were cycled according to the following test plan. The cycling test included a sequence of (1) charging the batteries, (2) allowing the batteries to rest for a 30 minute rest time, (3) discharging the batteries with a typical cellphone usage profile, and (4) allowing the batteries to battery relax for 30 minutes before starting another cycle. All tests were performed in a temperature-controlled environment at 25 degree Celsius.

The plot 192 shows, over several cycles, a degradation battery capacity when using the pseudo optimal charging profile (illustrated with the larger dots) in comparison with a degradation battery capacity when using the OEM suggested charging scheme (illustrated with the smaller dots). The plot 194 shows, over several cycles, an evolution of charge time when using the pseudo optimal charging profile (illustrated with the larger dots) in comparison with an evolution of charge time when using the OEM suggested charging scheme (illustrated with the smaller dots). The plot 196 shows, over several cycles, an evolution of swelling expansion when using the pseudo optimal charging profile (illustrated with the solid dotted lines) in comparison with an evolution of swelling expansion when using the OEM suggested charging scheme (illustrated with the circle dotted lines).

As can be seen, the pseudo optimal charging profile has a similar charge time as the OEM suggested charging scheme at beginning of life and keeps the same charge time throughout the experiment. In contrast, the charge time of the OEM suggested charging scheme decreases for the first 50 cycles due loosing cell capacity and then increases due to significant impedance rise. Additionally, the experimental results also confirm significant improvement in reducing thickness expansion rate when using the pseudo optimal charging profile. This is because the side reactions that cause accelerated aging are effectively mitigated, consequently reducing their byproducts.

Utilizing the Pseudo-Optimal Charging Profile in Embedded Applications

Figure 6:
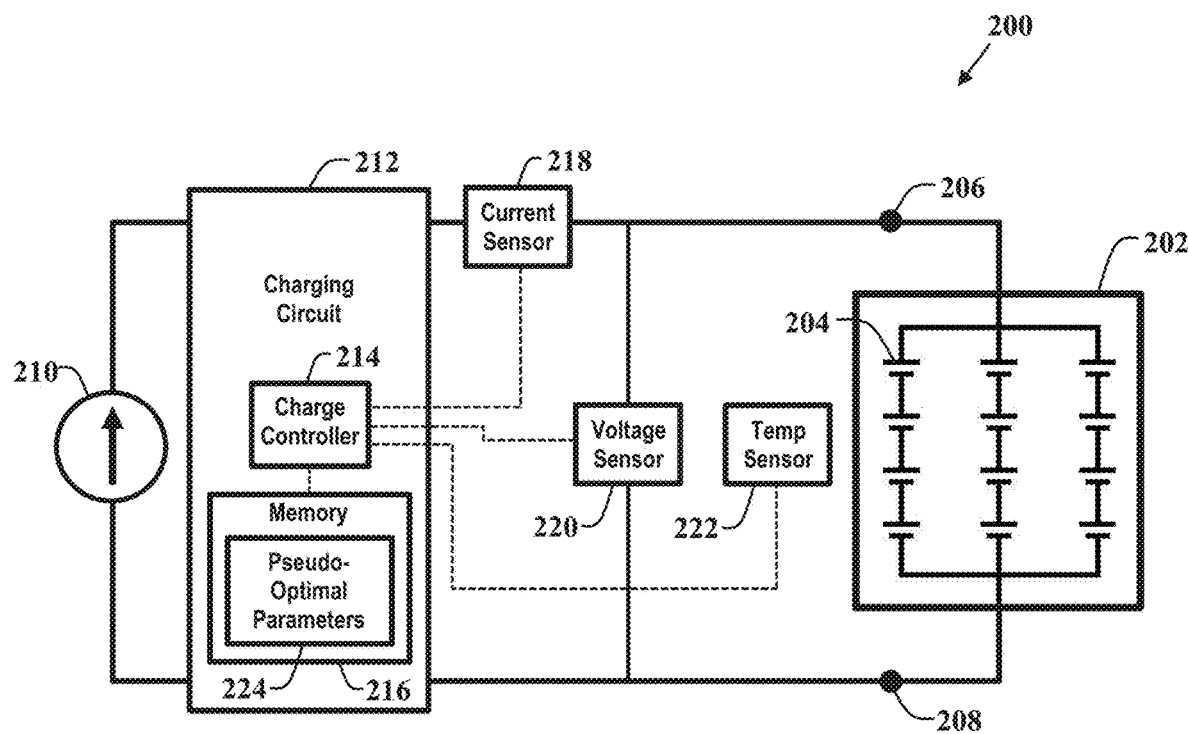
FIG. 6 shows a battery charging system which utilizes pseudo-optimal charging profiles.

FIG. 6 shows a battery charging system 200 which utilizes pseudo-optimal charging profiles. The system 200 includes a battery 202 configured to store electrochemical energy. The battery 202 includes one or more electrochemical cells 204 arranged in parallel and/or in series to form the battery 202. In one embodiment, the battery 202 is a lithium-ion battery and the electrochemical cells 204 are lithium-ion cells. The battery 202 includes a positive battery terminal 206 and a negative battery terminal 208 via which the battery 202 provides an output voltage and an output current. Additionally, the battery 202 is configured to be charged via the positive and negative battery terminals 206, 208.

The system 200 further includes a power source 210 and a charging circuit 212. The power source 210 is configured to, during a charging process, apply a charging current and/or a charging voltage to battery 202 via the positive and negative battery terminals 206, 208. In some embodiment, the power source 210 is configured to provide predetermined constant direct-current (DC) voltage or current. In some embodiments, the power source 210 is an alternating-current (AC) voltage or current source. In one embodiment, the power source 210 is a local electric grid (mains) configured to provide a single-phase or three-phase AC voltage having a predetermined frequency, such as 50 Hz or 60 Hz, and a predetermined nominal voltage, such as a nominal voltage between 110-127 volts or 220-240 volts.

A charging circuit 212 is connected between the power source 210 and the battery 202 and is configured to convert, regulate, and/or control the charging current and/or the charging voltage applied to the battery 202 by the power source 210. In some embodiments, the charging circuit 212 includes a charge controller 214 and memory 216 associated with or connected to the charge controller 214. The charging circuit 212 further includes various circuits and hardware configured to convert, regulate, and/or control a charging current and/or charging voltage applied to the battery 202 by the power source 210. The circuits and hardware may include components such as contactors, relays, transistors, transformers, diodes, capacitors, inductors, and resistors arranged in a conventional manner. In some embodiments, additional power conversion circuits may be arranged between the power source 210 and the charging circuit 212, such as a separate AC/DC converter.

The charge controller 214 is configured to operate switches and other components of the charging circuit 212 in order to convert, regulate, and/or control the charging current and/or the charging voltage applied to the battery 202 by the power source 210. In one embodiment, the charge controller 214 comprises a processor configured to execute program instructions which are stored on the memory 216. The memory 216 may be of any type of device capable of storing information accessible by the charge controller 214, such as a memory card, ROM, RAM, write-capable memories, read-only memories, hard drives, discs, flash memory, or any of various other computer-readable media serving as data storage devices as will be recognized by those of ordinary skill in the art. Additionally, it will be recognized by those of ordinary skill in the art that a "controller" or "processor" includes any hardware system, hardware mechanism or hardware component that processes data, signals, or other information. The charge controller 214 may include a system with a central processing unit, multiple processing units, dedicated circuitry for achieving specific functionality, or other systems.

The system 200 further includes a current sensor 218, voltage sensor 220, and a temperature sensor 222 configured to monitor battery current, battery voltage, and battery temperature, respectively, at least during the charging process. The charge controller 214 is operably connected to the current sensor 218, to the voltage sensor 220, and to the temperature sensor 222, and configured to receive measurement signals corresponding to the battery current, the battery voltage, and the battery temperature. In one embodiment, the current sensor 218 includes a shunt resistor arranged in series with the battery 202 which provides a voltage that is proportional to the battery current. In one embodiment, the current sensor 218 comprises a Hall Effect sensor arranged in series with the battery 202 and configured to measure the battery current. The voltage sensor 220 is connected in parallel with the battery 202 and is configured to measure a battery voltage across the positive and negative battery terminals 206, 208 of the battery 202. In some embodiments, the voltage sensor is further configured to measure voltages of individual cells 204 of the battery 202. In some embodiment, the charge controller 214 is configured to determine, calculate, and/or estimate further battery parameters such as state of charge, state of health, impedance, capacity, open-circuit voltage, and/or rest voltage.

The memory 216 is configured to store pseudo-optimal parameters 224 which define and/or characterize the ordered sequence of charging profile building blocks that form the pseudo-optimal charging profiles determined in the manner described above, as well as define the adaptation functions used to adapt the control parameters and threshold parameters for each charging profile building block as the battery 202 ages/degrades.

Figure 7:
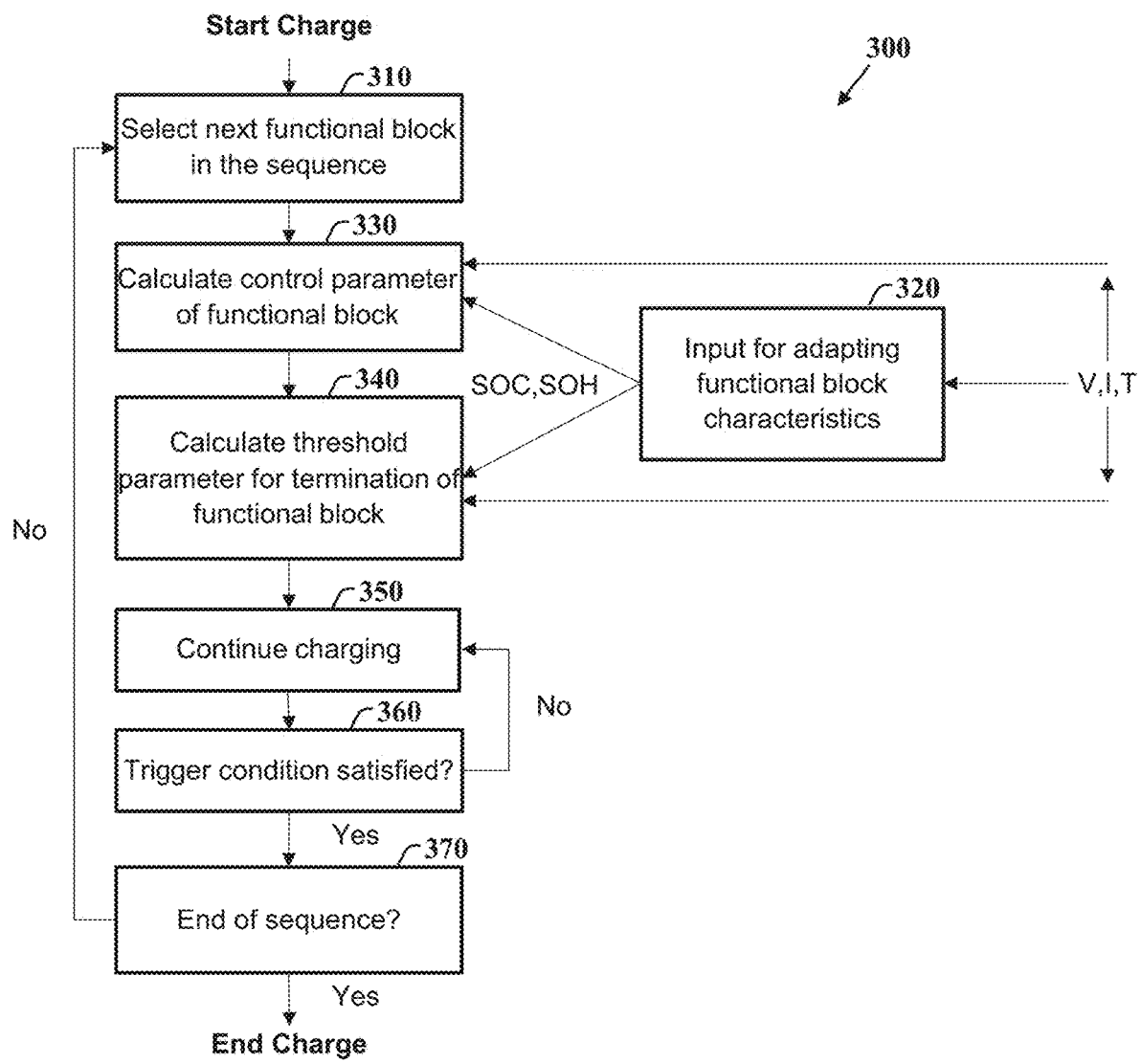
FIG. 7 shows a logical flow diagram for a method for operating the battery charging system to utilize the pseudo-optimal charging profiles.

FIG. 7 shows a logical flow diagram for a method 300 for operating the battery charging system 200 to utilize the pseudo-optimal charging profiles. Particularly, the charge controller 214 is configured to operate the charging circuit 212, with reference to pseudo-optimal parameters 224, to implement the functional building blocks of the pseudo optimal charging profile. The charge controller 214 is configured to select a first and/or next functional block in the sequence defined by the pseudo-optimal parameters 224 (block 310). The charge controller 214 is configured to receive measured values for voltage, current, and temperatures as inputs from the sensors 218, 220, and 222 and calculate a state of charge and/or a state of health of the battery 202 (block 320). Based on the measured values for voltage, current, and temperatures and the calculated values for state of charge and/or state of health, the charge controller 214 is configured to adapt the control parameters and threshold parameters of the pseudo-optimal parameters 224 with reference to adaptation parameters and adaptation functions thereof defined in the pseudo-optimal parameters 224 (blocks 330 and 340). The charge controller 214 is configured to charge the battery according the charging strategy of the functional block defined by the pseudo-optimal parameters 224 (block 350). In at least some embodiments, the charge controller 214 is configured to operate the charging circuit 212 using closed-loop feedback control based on the measured battery current and/or measured battery voltage to implement the functional building blocks. Particularly, the charge controller 214 is configured to vary the charging current based on a difference (error) between the measured battery current and/or measured battery voltage and the target battery current and/or target battery voltage. In this way, the charge controller 214 is configured to control a charging current in order to track a target battery current or target battery voltage, as dictated by the pseudo-optimal parameters 224. As the battery charges, the charge controller 214 is configured to continuously or periodically check if the trigger condition is satisfied by comparing the corresponding threshold parameter with a respective measured or calculated value (block 360) Once the trigger condition is satisfied, the charge controller 214 is configured to check if it is the end of the sequence (block 370). If more functional blocks remain in the sequence, the charge controller 214 is configured select the next function block (return to block 310). Otherwise, if no functional blocks remain in the sequence, the charge process is ended. By utilizing the pseudo-optimal charging profile defined by the pseudo-optimal parameters 224, the operation of the charge controller 214 is improved and charge time and/or battery degradation is reduced.

The herein described methods, processes, and program instructions (e.g., the charging profile synthesis program 28) improve the functioning of the processor 14 and the computing system 10 as a whole, respectively or in combination by enabling it/them to systematically derive a pseudo optimal charging profile for a specific battery, thus enabling real time implementation of strategies based on complex model based algorithms in a computationally constrained environment. As discussed above, the method 100 advances the state of art in algorithms for applications where it is not possible to run a full physics-based electrochemical model online, such as consumer electronic. The method 100 aids in the design of BMS strategy for battery charging that adapts to the battery ageing behavior. With a systematic approximation methodology, the features and advantages of a physics-based BMS can be captured in a computationally efficient manner. The pseudo optimal charging profile derived using the method 100 keeps the specific battery within an operating regime that prevents accelerated aging (i.e., without lithium-plating that leads to capacity degradation and safety issues, and without other undesirable reactions that lead to battery swelling, SEI growth, etc.) during charging while minimizing charging time without relying on a computationally expensive physics based BMS.

In at least one embodiment, a non-transitory copy of the programming instructions for individual ones of the aforementioned methods and processes (e.g., the charging profile synthesis program 28) may be placed into non-transitory storage devices (such as e.g., memory 16) during manufacture thereof, or in the field, through e.g., a distribution medium (not shown), such as a compact disc (CD), or through the network communications module 22 (from an remote server). That is, one or more distribution media having an implementation of the program may be employed to distribute the program to various computing devices.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of approximating an optimal charging profile for a particular battery, the method comprising:
   storing, in a memory, an electrochemical battery model that describes physical processes of batteries that lead to aging, the electrochemical battery model being parameterized based on physical characteristics of the particular battery;
   determining, with a processor, a first charging profile that minimizes a charging time for the particular battery and minimizes a degradation of the particular battery using the electrochemical battery model; and
   determining, with the processor, a first set of parameters that define a second charging profile that is formed by an ordered sequence of charging phases that approximates the first charging profile, each charging phase in the ordered sequence being characterized by (i) a respective first parameter in the first set of parameters indicating a respective control strategy that is to be used to control a charging current during the respective charging phase, (ii) a respective second parameter in the first set of parameters indicating a value of a control parameter of the respective control strategy, (iii) a respective third parameter in the first set of parameters indicating a respective trigger condition which, when satisfied, triggers the respective charging phase to end, and (iv) a respective fourth parameter in the first set of parameters indicating a value of a threshold parameter of the respective trigger condition, the determining of the first set of parameters that define the second charging profile further comprising:
   calculating, for each charging phase in the ordered sequence, a value of the respective second parameter and an value of the respective fourth parameter that (i) minimizes a difference between the first charging profile and the second charging profile and (ii) minimizes a difference between a degradation of the particular battery caused by the first charging profile and a degradation of the particular battery caused by the second charging profile.

2. The method according to claim 1, the determining of the first set of parameters that define the second charging profile further comprising:
   receiving, via an input device, for each charging phase in the ordered sequence, a value of the respective third parameter.

3. The method according to claim 1, the determining of the first set of parameters that define the second charging profile further comprising:
   calculating, for each charging phase in the ordered sequence, a value of the respective third parameter that (i) minimizes a difference between the first charging profile and the second charging profile and (ii) minimizes a difference between a degradation of the particular battery caused by the first charging profile and a degradation of the particular battery caused by the second charging profile.

4. The method according to claim 1, the determining of the first set of parameters that define the second charging profile further comprising:
   receiving, via an input device, for each charging phase in the ordered sequence, a value of the respective first parameter.

5. The method according to claim 1, the determining of the first set of parameters that define the second charging profile further comprising:
   calculating, for each charging phase in the ordered sequence, a value of the respective first parameter that (i) minimizes a difference between the first charging profile and the second charging profile and (ii) minimizes a difference between a degradation of the particular battery caused by the first charging profile and a degradation of the particular battery caused by the second charging profile.

6. The method according to claim 1, the determining of the first charging profile further comprising:

determining a plurality of first charging profiles that minimize the charging time for the particular battery and minimize the degradation of the particular battery using the electrochemical battery model, each first charging profile in the plurality of first charging profiles correspond to a different amount of degradation of the particular battery.

7. The method according to claim 6, the determining of the set of parameters that define the second charging profile further comprising:
determining the first set of parameters that define the second charging profile that is formed by the ordered sequence of charging phases that approximates a charging profile in the plurality of first charging profiles corresponding to a least amount of degradation of the particular battery.

8. The method according to claim 7, further comprising:
determining, with the processor, a second set of parameters used to adapt the second charging profile depending on an amount of degradation of the particular battery such that, when adapted using the second set of parameters based on a respective amount of degradation of the particular battery, the adapted second charging profile approximates a charging profile in the plurality of first charging profiles corresponding to respective amount of degradation of the particular battery.

9. The method according to claim 8, the determining of the second set of parameters used to adapt the second charging profile further comprising:
calculating (i) a value of a fifth parameter in the second set of parameters of a first adaptation function configured to adapt the second parameter in the first set of parameters depending on an amount of degradation of the particular battery and (ii) a value of a sixth parameter in the second set of parameters of a second adaptation function configured to adapt the fourth parameter in the first set of parameters depending on an amount of degradation of the particular battery that:
minimizes differences between the plurality of first charging profiles and the second charging profile adapted based on the respective amounts of degradation of the particular battery corresponding to each charging profile in the plurality of first charging profiles; and
minimizes differences between a degradation of the particular battery caused by each first charging profile in the plurality of first charging profiles and a degradation of the particular battery caused by the second charging profile adapted based on the respective amounts of degradation of the particular battery corresponding to each charging profile in the plurality of first charging profiles.

10. The method according to claim 9, wherein the first adaptation function is configured to adapt the second parameter in the first set of parameters depending on an amount of degradation of the particular battery and depending on a temperature of the battery.

11. The method according to claim 1, wherein, for at least one charging phase in the ordered sequence, the respective first parameter has one of (i) a first value indicating that the charging current is to be held a constant current defined by the respective second parameter during the respective at least one charging phase, (ii) a second value indicating that a battery voltage of the particular battery is to be held a constant voltage defined by the respective second parameter during the respective at least one charging phase, (iii) a third value indicating that a rate of change of the charging current is to be held a constant rate of current change defined by the respective second parameter during the respective at least one charging phase, and (iv) a fourth value indicating that a rate of change of the battery voltage is to be held a constant rate of voltage change defined by the respective second parameter during the respective at least one charging phase.

12. The method according to claim 1, wherein, for at least one charging phase in the ordered sequence, the respective third parameter has one of (i) first value indicating that the respective at least one charging phase is to end in response to a battery voltage of the particular battery exceeding a voltage threshold defined by the respective fourth parameter, (ii) a second value indicating that the respective at least one charging phase is to end in response to the charging current falling below a current threshold defined by the respective fourth parameter, (iii) a third value indicating that the respective at least one charging phase is to end in response to a state of charge of the particular battery exceeding a state of charge threshold defined by the respective fourth parameter, (iv) a fourth value indicating that the respective at least one charging phase is to end in response to a temperature of the particular battery exceeding a temperature threshold defined by the respective fourth parameter, and (v) a fifth value indicating that the respective at least one charging phase is to end in response to a time duration of the respective at least one charging phase exceeding a time duration threshold defined by the respective fourth parameter.

13. The method according to claim 1, further comprising, prior to the determining of the first charging profile:
receiving, with the processor, characteristic data defining physical characteristics of the particular battery; and
determining values of undefined parameters of the electrochemical battery model based on the characteristic data.

14. The method according to claim 1, further comprising:
operating a display device to display a visual comparison of the first charging profile and the second charging profile.

15. A system for approximating an optimal charging profile for a particular battery, the system comprising:
a data storage device configured to a plurality of instructions, the plurality of instructions including instructions corresponding to an electrochemical battery model that models physical processes of a battery that lead to aging, the electrochemical battery model being parameterized based on physical characteristics of the particular battery; and
at least one processor operably connected to the data storage device, the at least one processor being configured to execute the plurality of instructions on the data storage device to:
determine a plurality of first charging profiles that minimizes a charging time for the particular battery and minimizes a degradation of the particular battery using the electrochemical battery model, each first charging profile in the plurality of first charging profiles correspond to a different amount of degradation of the particular battery;
determine a first set of parameters that define a second charging profile that is formed by an ordered sequence of charging phases that approximates a charging profile in the plurality of first charging profiles corresponding to a least amount of degradation of the particular battery, each charging phase in the ordered sequence being characterized by (i) a respective first parameter in the first set of parameters indicating a respective control strategy that is to be used to control a charging current during the respective charging phase, (ii) a respective second parameter in the first set of parameters indicating a value of a control parameter of the respective control strategy, (iii) a respective third parameter in the first set of parameters indicating a respective trigger condition which, when satisfied, triggers the respective charging phase to end, and (iv) a respective fourth parameter in the first set of parameters indicating a value of a threshold parameter of the respective trigger condition.

16. A non-transitory computer readable medium for approximating an optimal charging profile for a particular battery, the computer readable medium storing a plurality of instructions which are configured to, when executed, cause at least one processor to:

store, in a memory, an electrochemical battery model that models physical processes of a battery that lead to aging, the electrochemical battery model being parameterized based on physical characteristics of the particular battery;

determine a first charging profile that minimizes a charging time for the particular battery and minimizes a degradation of the particular battery using the electrochemical battery model; and determine a first set of parameters that define a second charging profile that is formed by an ordered sequence of charging phases that approximates the first charging profile, each charging phase in the ordered sequence being characterized by (i) a respective first parameter in the first set of parameters indicating a respective control strategy that is to be used to control a charging current during the respective charging phase, (ii) a respective second parameter in the first set of parameters indicating a value of a control parameter of the respective control strategy, (iii) a respective third parameter in the first set of parameters indicating a respective trigger condition which, when satisfied, triggers the respective charging phase to end, and (iv) a respective fourth parameter in the first set of parameters indicating a value of a threshold parameter of the respective trigger condition, wherein, for at least one charging phase in the ordered sequence, the respective first parameter has one of (i) a first value indicating that the charging current is to be held a constant current defined by the respective second parameter during the respective at least one charging phase, (ii) a second value indicating that a battery voltage of the particular battery is to be held a constant voltage defined by the respective second parameter during the respective at least one charging phase, (iii) a third value indicating that a rate of change of the charging current is to be held a constant rate of current change defined by the respective second parameter during the respective at least one charging phase, and (iv) a fourth value indicating that a rate of change of the battery voltage is to be held a constant rate of voltage change defined by the respective second parameter during the respective at least one charging phase.

* * * * *